United States Patent
Wager, III et al.

(10) Patent No.: US 7,339,187 B2
(45) Date of Patent: *Mar. 4, 2008

(54) TRANSISTOR STRUCTURES

(75) Inventors: John F. Wager, III, Corvallis, OR (US); Randy L. Hoffman, Corvallis, OR (US)

(73) Assignee: State of Oregon acting by and through the Oregon State Board of Higher Education on behalf of Oregon State University, Corvallis, OR (US)

(*) Notice: Subject to any disclaimer, the term of this patent is extended or adjusted under 35 U.S.C. 154(b) by 16 days.

This patent is subject to a terminal disclaimer.

(21) Appl. No.: 10/350,819

(22) Filed: Jan. 24, 2003

(65) Prior Publication Data

US 2003/0218222 A1 Nov. 27, 2003

Related U.S. Application Data

(63) Continuation-in-part of application No. 10/307,162, filed on Nov. 27, 2002, now Pat. No. 7,189,992.

(60) Provisional application No. 60/382,696, filed on May 21, 2002.

(51) Int. Cl.
*H01L 29/24* (2006.01)

(52) U.S. Cl. .................. 257/43; 257/613; 257/E29.1

(58) Field of Classification Search .............. 257/43, 257/613, E29.1; 438/85, 104
See application file for complete search history.

(56) References Cited

U.S. PATENT DOCUMENTS

| 4,823,803 | A | 4/1989 | Nakamura | |
| 6,281,552 | B1 | 8/2001 | Kawasaki et al. | 257/350 |
| 6,291,837 | B1 | 9/2001 | Nakajima et al. | 257/57 |
| 6,563,174 | B2 | 5/2003 | Kawasaki et al. | 257/350 |
| 6,617,209 | B1 | 9/2003 | Chau et al. | |
| 2002/0056838 | A1 | 5/2002 | Ogawa | |

(Continued)

FOREIGN PATENT DOCUMENTS

EP 1 134 811 A1 * 9/2001

(Continued)

OTHER PUBLICATIONS

G.Golan et al., A linear model application for the design of transparent conductive In2O3 coatings, 1998, Elsevier, Microelectronics Journal 29, pp. 689-694.*

(Continued)

*Primary Examiner*—Matthew C. Landau
(74) *Attorney, Agent, or Firm*—Klarquist Sparkman, LLP

(57) ABSTRACT

Enhancement mode, field effect transistors wherein at least a portion of the transistor structure may be substantially transparent. One variant of the transistor includes a channel layer comprising a substantially insulating, substantially transparent, material selected from ZnO, $SnO_2$, or $In_2O_3$. A gate insulator layer comprising a substantially transparent material is located adjacent to the channel layer so as to define a channel layer/gate insulator layer interface. A second variant of the transistor includes a channel layer comprising a substantially transparent material selected from substantially insulating ZnO, $SnO_2$ or $In_2O_3$, the substantially insulating ZnO, $SnO_2$, or $In_2O_3$ being produced by annealing. Devices that include the transistors and methods for making the transistors are also disclosed.

57 Claims, 12 Drawing Sheets

U.S. PATENT DOCUMENTS

| | | | |
|---|---|---|---|
| 2003/0047785 A1 | 3/2003 | Kawasaki et al. | 257/350 |
| 2003/0218221 A1 | 11/2003 | Wager et al. | |
| 2004/0023432 A1 | 2/2004 | Haga | |
| 2004/0127038 A1* | 7/2004 | Carcia et al. | 438/689 |

FOREIGN PATENT DOCUMENTS

| | | |
|---|---|---|
| JP | 05-251705 | 9/1993 |
| JP | 06-067187 | 3/1994 |
| JP | 407202208 | 8/1995 |
| JP | 10041477 A | 2/1998 |
| JP | 2000150900 | 5/2000 |
| JP | 2001244464 | 9/2001 |
| JP | 2001244464 A | 9/2001 |
| JP | 2002076356 | 3/2002 |
| JP | 2003-086808 | 3/2003 |

OTHER PUBLICATIONS

Kawasaki et al., "Can ZnO Eat Market in Optoelectronic Applications?," *Extended Abstracts of the 2000 International Conference on Solid State Devices and Materials*, pp. 128-129, Sendai, 2000.

Ohya et al., *Jpn. J. Appln. Phys.* 40(1):297-298, 2001.

Jiménez-González et al., "Optical and electrical characteristics of aluminum-doped Zn) thin films prepared by solgel technique," *Journal of Crystal Growth* 192:430-438, 1998.

Lee et al., "Electrical and optical properties of ZnO transparent conducting films by the sol-gel method," *Journal of Crystal Growth* 247:119-125, 2003.

Natsume et al., "Zinc oxide films prepared by sol-gel spin-coating," *Thin Solid Films* 372:30-36, 2000.

Nishii et al., "High Mobility Thin Film Transistors with Transparent ZnO Channels," *The Japan Society of Applied Physics* 42(2)(4A):L347-L349, 2003.

Nishio et al., "Preparation of highly oriented thin film exhibiting transparent conduction by sol-gel process," *Journal of Materials Science* 31:3651-3656, 1996.

Norris et al., "Spin-coated zinc oxide transparent transistors," *Journal of Physics D: Applied Physics* 36:L105-L107, 2003.

Ohya et al., "Preparation of transparent, electrically conducting ZnO film from zinc acetate and alkoxide," *Journal of Materials Science* 29:4099-4103, 1994.

Ohya et al., "Thin Film Transistor of ZnO Fabricated by Chemical Solution Deposition," *The Japan Society of Applied Physics* 40(1)(1):297-298, 2001.

Ohya et al., "Microstructure of Sol-Gel ZnO Thin Films Fabricated Using Ethanolamine and Hydroxyketone Modifiers," *Journal of the Ceramic Society of Japan* 113(3):220-225, 2005.

Shaoqiang et al., "Nanocrystalline ZnO thin flims on porous silicon/silicon substrates obtained by sol-gel technique," *Applied Surface Science* 241:384-391, 2005.

Wessler et al., "Textured ZnO thin films on (0001) sapphire produced by chemical solution deposition," *J. Matter. Res.* 17(7):1644-1650, 2002.

Ohtomo et al., "Novel Semiconductor Technologies of Zn Films Towards Ultraviolet LEDs and Invisible FETs," *IEICE Trans. Electron.* E83-C(10):1614-1617, 2000.

* cited by examiner

TRANSISTOR STRUCTURES

PRIORITY CLAIM

This application is a continuation-in-part of U.S. patent application Ser. No. 10/307,162, filed Nov. 27, 2002, now U.S. Pat. No. 7,189,992 which claims benefit of U.S. Provisional Application No. 60/382,696, filed May 21, 2002.

STATEMENT OF GOVERNMENT SUPPORT

This invention was made with United States Government support under Grant No. NSF: 0071727, awarded by the National Science Foundation. The United States Government has certain rights in the invention.

FIELD

The present disclosure relates to transistor structures such as, for example, transparent transistors.

BACKGROUND

The microelectronics industry and research community is undertaking efforts to fabricate electronic devices (e.g., diodes and transistors) that are transparent to the portion of the electromagnetic spectrum that is visible to the human eye. Circuits made of such devices would offer unique opportunities for innovation or improvement of consumer-, automotive-, and military-electronics systems.

For example, active-matrix liquid crystal displays (AM-LCD) are employed extensively in laptop computers and other information display products. The operation of an AMLCD display requires that each picture or display element (pixel) have a corresponding thin-film transistor (TFT) associated with it for selecting or addressing the pixel to be on or off. Currently, AMLCD displays employ transistor materials that may be deposited onto glass substrates but are not transparent (usually amorphous, polycrystalline, or continuous-grain silicon are the materials used to fabricate TFTs on glass). Thus, the portion of the display glass occupied by the addressing electronics is not available for transmission of light through the display. Therefore, the availability of transparent transistors for AMLCD addressing would improve display performance by allowing more light to be transmitted through the display.

BRIEF DESCRIPTION OF THE DRAWINGS

Certain embodiments will be described in more detail with reference to the following drawings.

DETAILED DESCRIPTION OF SEVERAL EMBODIMENTS

Figure 1:
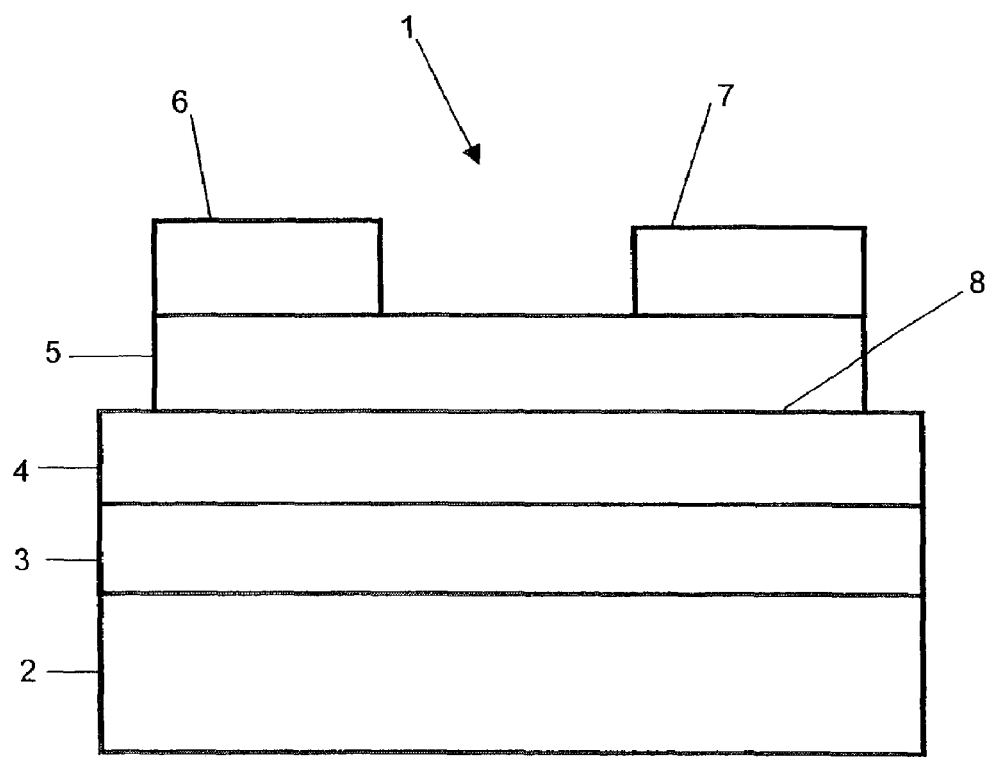
FIG. 1 is a sectional view of a first embodiment of a presently disclosed transistor structure.

For ease of understanding, the following terms used herein are described below in more detail:

"Enhancement-mode transistor" means a transistor in which there is negligible off-current flow, relative to on-current flow, between a source and a drain at zero gate voltage. In other words, the transistor device is "normally off." In contrast, a depletion-mode transistor is "normally on" meaning that more than a substantially negligible current flows between a source and a drain at zero gate voltage.

"Gate" generally refers to the insulated gate terminal of a three terminal FET when used in the context of a transistor circuit configuration.

"Substantially insulating" can include insulating materials (e.g., materials having a resistivity of greater than about $10^{10}$ Ω-cm) and semi-insulating materials (e.g., materials having a resistivity of about $10^3$ Ω-cm to about $10^{10}$ Ω-cm).

"Substantially transparent" generally denotes a material or construct that does not absorb a substantial amount of light in the visible portion (and/or infrared portion in certain variants) of the electromagnetic spectrum.

"Vertical" means substantially perpendicular to the surface of a substrate.

The preceding term descriptions are provided solely to aid the reader, and should not be construed to have a scope less than that understood by a person of ordinary skill in the art or as limiting the scope of the appended claims.

Disclosed herein are enhancement mode, field effect transistors wherein at least a portion of the transistor structure may be substantially transparent. Devices that include the transistors and methods for making the transistors are also disclosed.

One variant of the transistor includes a channel layer comprising a substantially insulating, substantially transparent, material selected from ZnO, $SnO_2$, or $In_2O_3$. A gate insulator layer comprising a substantially transparent material is located adjacent to the channel layer so as to define a channel layer/gate insulator layer interface. The transistor also includes a source that can inject electrons into the channel layer for accumulation at the channel layer/gate insulator layer interface and a drain that can extract electrons from the channel layer.

A second variant of the transistor includes a channel layer comprising a substantially transparent material selected from substantially insulating ZnO, substantially insulating $SnO_2$, or substantially insulating $In_2O_3$, the substantially insulating ZnO, substantially insulating $SnO_2$, or substantially insulating $In_2O_3$ being produced by annealing. A gate insulator layer is located adjacent to the channel layer and comprises a substantially transparent material. The transistor also includes a source, a drain, and a gate electrode.

A method for making the transistors includes providing a gate insulating layer, depositing ZnO, $SnO_2$ or $In_2O_3$ onto at least a portion of a surface of the gate insulating layer, and annealing the ZnO, $SnO_2$ or $In_2O_3$ for about 1 minute to about 2 hours at a temperature of about 300 to about 1000° C. in an oxidative atmosphere.

The transistors may be included in optoelectronic display devices as switches coupled to at least one display element. Another disclosed device is a substantially transparent, dynamic random-access memory cell, comprising a substantially transparent capacitor coupled to the transistor. A further application of the transistors is in substantially transparent inverters wherein the transistor is coupled to a load device.

In general, the transistor structure includes a substrate, a gate electrode, a gate insulator layer, a channel layer, a source and a drain. The channel layer may be positioned adjacent to the gate insulator layer so that a surface of the channel layer is contiguous with a surface of the gate insulator layer. The contact region of the channel layer surface and the gate insulator layer surface is referred to herein as the channel layer/gate insulator layer interface. In exemplary constructs, the channel layer insulating material is different than the gate insulator layer material and the channel layer/gate insulator layer interface defines a discrete material boundary.

A feature of an embodiment of the transistor structure is that the channel layer/gate insulator layer interface may define a conducting channel for the flow of electrons from the source to the drain. In other words, the transistor may be classified as a "surface-channel" or "interface-channel" device. The applied gate voltage facilitates electron accumulation in the channel layer/gate insulator layer interface region. In addition, the applied voltage enhances electron injection from the source to the channel layer/gate insulator layer interface and electron extraction therefrom by the drain.

Another characteristic of the transistor structure is that selected embodiments of the construct or combination of the channel layer and the gate insulator layer may exhibit an optical transmission of at least about 90%, more particularly at least about 95%, across the visible portion (and/or infrared portion in certain variants) of the electromagnetic spectrum. Each of the additional components of the structure (i.e., substrate, gate electrode, source/drain terminals) may be optionally opaque or substantially transparent depending upon the desired end use of the transistor. In certain embodiments, the transistor structure as a whole (and/or individual components of the transistor) may exhibit an optical transmission of at least about 50%, more particularly at least about 70%, and most particularly at least about 90%, across the visible portion (and/or infrared portion in certain variants) of the electromagnetic spectrum.

A further feature of the FET disclosed herein is that it may easily be fabricated as a thin film transistor (TFT). For example, relatively low processing temperatures (e.g., not exceeding about 800° C.) may be used and there is no need for ion implanting to set the channel threshold voltage and define the source and drain contacts in certain variants of the FET structure. Such TFTs typically are very useful in association with optoelectronic device as explained below in more detail.

The channel layer typically is made from a substantially insulating material that is also substantially transparent. A negligible amount of electrons is inherently available in the bulk portion of the channel layer since the channel layer is made from a substantially insulating material. In addition, the substantially insulating channel layer may provide inherent electrical isolation for multiple devices sharing a continuous channel layer film (with patterned gate, source, and drain electrodes defining each device). Such inherent device isolation means that patterning of the channel layer film is not necessary since conductivity at the channel layer/gate insulator layer is exhibited only beneath the patterned gate electrodes.

Illustrative materials for the channel layer include ZnO, $SnO_2$ and $In_2O_3$. Insulating ZnO, $SnO_2$, and $In_2O_3$ may be made by an annealing process, particularly rapid thermal annealing (RTA). Such insulating ZnO, $SnO_2$ and $In_2O_3$ typically exhibit a bandgap of less than about 5 eV.

For example, a layer of ZnO may be deposited (e.g., by sputtering, chemical vapor deposition, spin coating, physical vapor deposition, vapor phase epitaxy, molecular beam epitaxy, etc.) and subsequently undergo annealing for about 1 minute to about 2 hours, more particularly about 1 minute to about 1 hour, and about 1 minute to about 5 minutes in certain instances, at a temperature of about 300 to about 1000° C., particularly about 700 to about 800° C., in a substantially oxidative atmosphere. Although not bound by any theory, it is believed that such a process should result in the incorporation of more oxygen into the ZnO layer, thus reducing the oxygen vacancy concentration or degree of oxygen deficiency. Oxygen vacancies or oxygen deficiency in ZnO can render it n-type and conductive. High temperature (i.e., at least about 700° C.) annealing in inert atmospheres such as argon may also produce insulating ZnO. Although not bound by any theory, such higher temperature anneals may improve the ZnO crystallinity, thus improving the electron transport properties. Such insulating ZnO may or may not be doped. If doped, the resistivity of the ZnO may also be enhanced by substitutional doping with an acceptor dopant such as, for example, N, Cu, Li, Na, K, Rb, P, As, and mixtures thereof.

Similarly, a layer of $SnO_2$ may be deposited (e.g., by sputtering, chemical vapor deposition, spin coating, physical vapor deposition, vapor phase epitaxy, molecular beam epitaxy, etc.) and subsequently undergo annealing for about 1 minute to about 2 hours, more particularly about 1 minute to about 1 hour, and about 1 minute to about 5 minutes in certain instances, at a temperature of about 300 to about 1000° C., particularly about 700 to about 900° C., in a substantially oxidative atmosphere. Although not bound by any theory, it is believed that such a process should result in the incorporation of more oxygen into the $SnO_2$ layer, thus reducing the oxygen vacancy concentration or degree of oxygen deficiency. Oxygen vacancies or oxygen deficiency in $SnO_2$ can render it n-type and conductive. High temperature (i.e., greater than about 700° C.) annealing in inert atmospheres such as argon may also produce insulating $SnO_2$. Although not bound by any theory, such higher temperature anneals may improve the $SnO_2$ crystallinity, thus improving the electron transport properties. The resistivity of the $SnO_2$ may also be enhanced by substitutional doping with an acceptor dopant such as, for example, Al, In, Ga, Bi, B, La, Sc, Y, Lu, Er, Ho, N, P, As, and mixtures thereof.

Also similarly, a layer of $In_2O_3$ may be deposited (e.g., by sputtering, chemical vapor deposition, spin coating, physical vapor deposition, vapor phase epitaxy, molecular beam epitaxy, etc.) and subsequently undergo annealing for about 1 minute to about 2 hours, more particularly about 1 minute to about 1 hour, and about 1 minute to about 5 minutes in certain instances, at a temperature of about 300 to about 1000° C., particularly about 700 to about 900° C., in a substantially oxidative atmosphere. Although not bound by any theory, it is believed that such a process should result in the incorporation of more oxygen into the $In_2O_3$ layer, thus reducing the oxygen vacancy concentration or degree of oxygen deficiency. Oxygen vacancies or oxygen deficiency in $In_2O_3$ can render it n-type and conductive. High temperature (i.e., greater than about 700° C.) annealing in inert atmospheres such as argon may also produce insulating $In_2O_3$. Although not bound by any theory, such higher temperature anneals may improve the $In_2O_3$ crystallinity, thus improving the electron transport properties. The resistivity of the $In_2O_3$ may also be enhanced by substitutional doping with an acceptor dopant such as, for example, Be, Mg, Ca, Sr, Ba, N, P, As, Zn, Cd, and mixtures thereof.

According to particular embodiments, the ZnO, $SnO_2$, or $In_2O_3$ layer may be sputter deposited in an atmosphere that includes at least one sputter gas, and at least one film-modifying gas. The film-modifying gas may be any gas that can enhance the resistivity of the film via incorporation into the film on an atomic or sub-atomic level. For example, a film-modifying gas may be an oxidative gas whose molecules, atoms or ions are incorporated into the film so that they occupy oxygen vacancies or deficiencies in the film as described above. Another film-modifying gas may be a dopant gas whose molecules, atoms or ions are incorporated into the film so that they increase the resistivity of the film. Illustrative sputter gases include Ar, Ne, and mixtures thereof. Illustrative oxidative gases include $O_2$, $N_2O$ and mixtures thereof. Illustrative dopant gases include $N_2$, $NH_3$ and other gases containing the dopant species listed above. The concentrations of the gases in the sputter atmosphere may be varied depending upon the desired characteristics of the film. For example, the concentration of oxidative gas may range from about 0 to about 50 volume percent. The concentration of dopant gas may range from about 0 to about 50 volume percent. The concentration of sputter gas may range from about 0 to about 100 volume percent. The sputtering conditions may also be varied depending upon the desired characteristics of the film. For instance, the temperature may range from about room temperature to 600° C., and the pressure may range from about 1 mTorr to about 50 mTorr. In a specific example, an undoped ZnO target may be sputter deposited in an atmosphere that includes 80 volume percent Ar, 10 volume percent $N_2$, and 10 volume percent $O_2$.

The thickness of the channel layer may vary, and according to particular examples it can range from about 10 to about 500 nm. The channel length also may vary, and according to particular examples it can range from about 1,000 to about 100,000 nm.

The gate insulator layer may be made from any material exhibiting insulating properties required for gate insulators, particularly a substantially transparent material. Gate insulator materials typically exhibit a bandgap of greater than about 5 eV. Illustrative materials include substantially transparent materials such as aluminum-titanium oxide ($Al_2O_3$/ $TiO_2$), $Al_2O_3$, MgO, $SiO_2$, silicon nitride, and silicon oxynitride. One distinctive example of a substantially transparent material is aluminum-titanium oxide grown by atomic layer deposition. The thickness of the gate insulator layer may vary, and according to particular examples it can range from about 10 to about 300 nm. The gate insulator layer may be introduced into the structure by techniques such as chemical vapor deposition, sputtering, atomic layer deposition, or evaporation.

Source/drain terminals refer to the terminals of a FET, between which conduction occurs under the influence of an electric field. Designers often designate a particular source/drain terminal to be a "source" or a "drain" on the basis of the voltage to be applied to that terminal when the FET is operated in a circuit. The source and drain may be made from any suitable conductive material such as an n-type material. The source and drain materials are optionally opaque materials or substantially transparent materials. Illustrative materials include transparent, n-type conductors such as indium-tin oxide (ITO), ZnO, $SnO_2$, or $In_2O_3$ or opaque metals such as Al, Cu, Au, Pt, W, Ni, or Ti. Especially useful materials for the source and drain are those that can inject (and extract) electrons into the channel layer insulating material. Examples of such electron injection materials include indium-tin oxide, $LaB_6$, and ZnO:Al.

The source and drain may be introduced into the structure by techniques such as chemical vapor deposition, sputtering, evaporation, and/or doping of the channel layer material via diffusion or ion implantation. The source and drain terminals may be fabricated such that they are geometrically symmetrical or non-symmetrical.

The gate electrode may be made from any suitable conductive material. The gate electrode material is optionally an opaque material or a substantially transparent material. Illustrative gate electrode materials include transparent, n-type conductors such as indium-tin oxide (ITO), ZnO, $SnO_2$, or $In_2O_3$, or opaque metals such as Al, Cu, Au, Pt, W, Ni, or Ti. The thickness of the gate electrode may vary, and according to particular examples it can range from about 50 to about 1000 nm. The gate electrode may be introduced into the structure by chemical vapor deposition, sputtering, evaporation and/or doping.

"Substrate", as used herein, refers to the physical object that is the basic workpiece that is transformed by various process operations into the desired microelectronic configuration. A substrate may also be referred to as a wafer. Wafers may be made of semiconducting, non-semiconducting, or combinations of semiconducting and non-semiconducting materials. The substrate may be made from any suitable material. The substrate material is optionally an opaque material or a substantially transparent material. Illustrative substrate materials include glass and silicon. The thickness of the substrate may vary, and according to particular examples it can range from about 100 μm to about 1 cm.

Electrical contact to the gate electrode, source, drain and substrate may be provided in any manner. For example, metal lines, traces, wires, interconnects, conductors, signal paths and signaling mediums may be used for providing the desired electrical connections. The related terms listed above, are generally interchangeable, and appear in order from specific to general. Metal lines, generally aluminum (Al), copper (Cu) or an alloy of Al and Cu, are conductors that provide signal paths for coupling or interconnecting, electrical circuitry. Conductors other than metal may also be utilized.

An illustrative n-channel operation of the transistor involves applying a positive voltage to the gate electrode, grounding the source, and applying a positive voltage to the drain. For example, a voltage of about 5 to about 40 V may be applied to the gate electrode and the drain during operation. The threshold voltage may range from about 1 to about 20 V. Electrons flow from the source, along the conducting channel created at the channel layer/gate insulator layer interface, and out of the transistor through the drain. The effective mobility of the electrons at the interface may vary depending upon the specific structure, but could range, for example, from about 0.05 to about 20 $cm^2V^{-1}s^{-1}$. Simply removing the positive voltage applied to the gate electrode turns the transistor off since the transistor is an enhancement-mode transistor.

The transistor structures disclosed herein may be used for fabricating chips, integrated circuits, monolithic devices, semiconductor devices, and microelectronic devices. One example of a microelectronic device is an optoelectronic device. An illustrative optoelectronic device is an active-matrix liquid-crystal display (AMLCD).

One exemplar device is an optoelectronic display device that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transparent transistor is sufficiently fast for switching the display element at such a high frequency that the use of the transparent transistor as a switching element in a liquid crystal display is possible. The display element acts in electrical terms as a capacitor that is charged or discharged by the accompanying transparent transistor. The optoelectronic display device may include many display elements each with its own transparent transistor, for example, arranged in a matrix. The transparent transistors may be arrayed for LCD devices as described, for example, in Kim, "Thin Film-Transistor Device Design", Information Display 2/02, p. 26 (2002).

Figure 11:
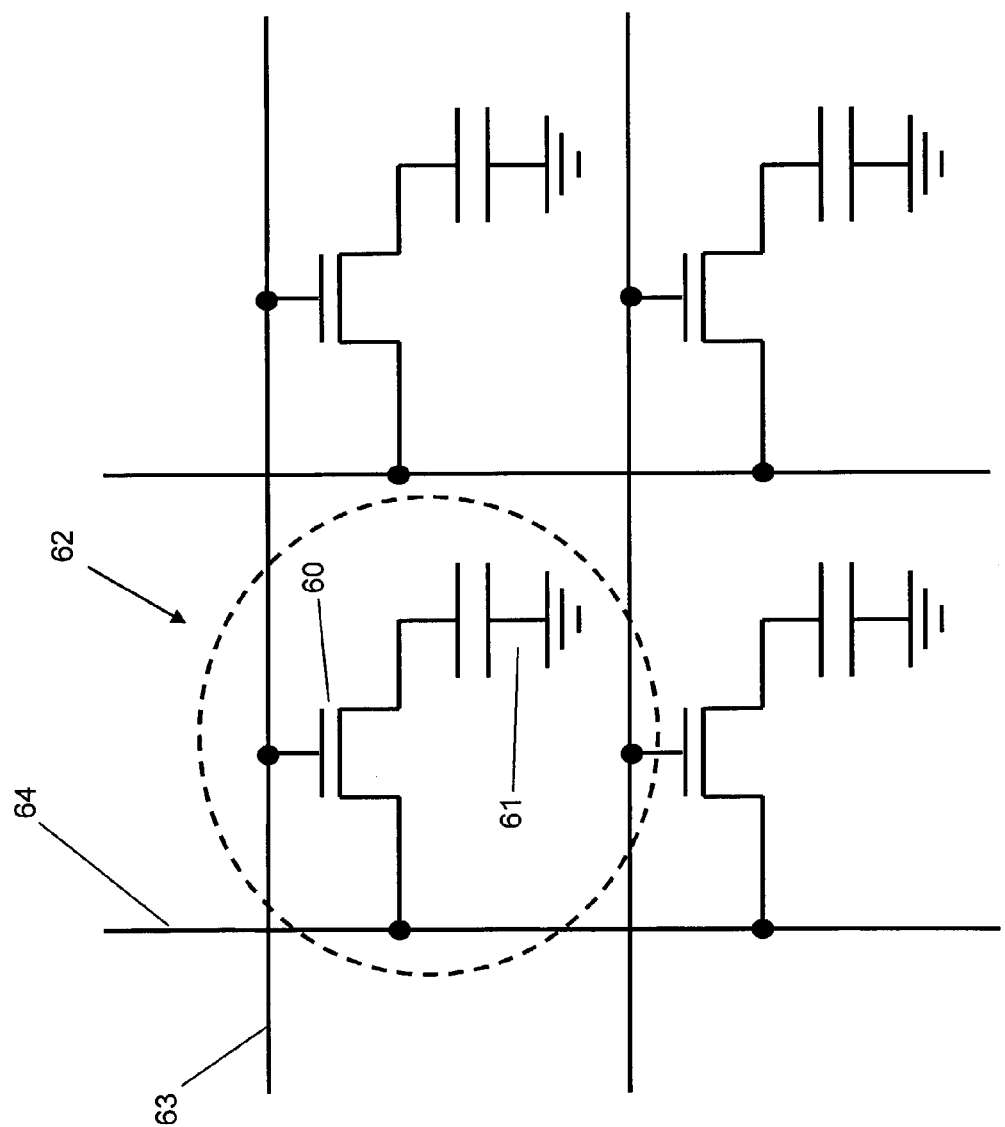
FIG. 11 is a schematic representation of an example of a cell circuit for an AMLCD that includes the presently disclosed transistor structure.

One specific example of an AMLCD cell circuit is depicted in FIG. 11. The AMLCD cell circuit includes a transistor 60 as presently described, and a LCD pixel 61 electrically coupled thereto. The transistor 60 and the LCD pixel 61 together form a transistor/pixel cell 62. In the arrangement shown, the transistor 60 is electrically coupled to the LCD pixel 61 via the drain electrode. The gate electrode of the transistor 60 is electrically coupled to a row or control line 63 that receives on/off input for the transistor 60. The source electrode of the transistor 60 is electrically coupled to a column or data line 64 that receives a signal for controlling the LCD pixel 61.

Other examples of microelectronic devices that could employ the transistor structure shown herein include inverters, analog amplifiers and single-transistor dynamic random-access memory (DRAM) cells, and like devices.

For instance, a transparent enhancement-mode transistor whose source is connected to one terminal of a transparent capacitor, while the other terminal of the capacitor is grounded, constitutes a transparent single-transistor dynamic random-access memory (DRAM) cell. In such a DRAM cell, information is stored as charge on a capacitor, with the enhancement-mode transistor serving as an access transistor that controls the capacitor charge state. Usually in such a DRAM cell, a logic 0 is represented by negligible capacitor charge and a concomitantly small capacitor voltage. In contrast, a logic 1 is obtained by charging the capacitor, thus increasing the capacitor voltage until it approaches the power supply voltage.

The entire DRAM cell described herein, or a portion thereof, is transparent. Fabricating transparent capacitors and connecting them to a transparent transistor to realize a DRAM cell can be accomplished using various techniques. Specifically, a transparent capacitor may be constructed by sandwiching a transparent insulator layer, using materials such as $Al_2O_3$ or $SiO_2$, between two transparent conductors, using materials such as indium-tin oxide, ZnO, or $SnO_2$.

Figure 12:
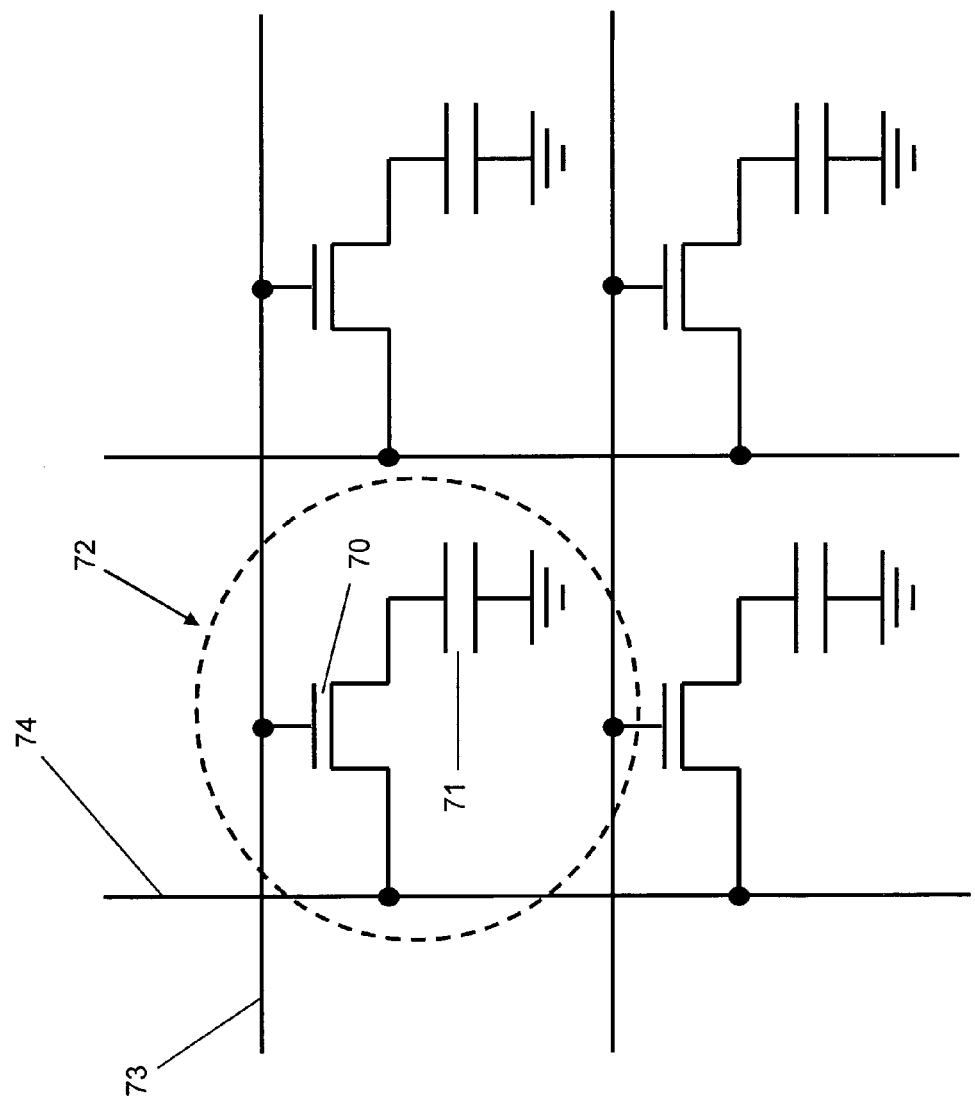
FIG. 12 is a schematic representation of an example of a dynamic random-access memory (DRAM) cell circuit that includes the presently disclosed transistor structure.

One specific example of a DRAM cell circuit is depicted in FIG. 12. The DRAM cell circuit includes a transistor 70 as presently described, and a storage capacitor 71 electrically coupled thereto. The transistor 70 and the storage capacitor 71 together form a transistor/capacitor cell 72. In the arrangement shown, the transistor 70 is electrically coupled to the storage capacitor 71 via the drain electrode. The gate electrode of the transistor 70 is electrically coupled to a row or write line 73 that receives on/off input for the transistor 70. The source electrode of the transistor 70 is electrically coupled to a column or data line 74 that receives a signal for controlling what is stored on the storage capacitor 71.

Illustrative examples of specific transistor structures are shown in FIGS. 1-3 and FIGS. 8-10. The specific examples described below are for illustrative purposes and should not be considered as limiting the scope of the appended claims. In FIGS. 1-3 and 8-10 like reference numerals refer to like elements unless otherwise indicated.

FIG. 1

A TFT structure 1 is illustrated that was fabricated on a one-inch by one-inch thick composite substrate. The platform includes a glass substrate 2, a 200 nm thick, indium-tin oxide (ITO) gate electrode 3 coated on the substrate 2, and a 200 nm thick, aluminum-titanium oxide gate insulator layer 4.

A ZnO channel and an ITO source/drain electrode film was deposited via ion beam sputtering in $10^{-4}$ Torr of $Ar/O_2$ (80%/20%); the substrate was unheated during deposition. The ZnO channel layer 5 (100 nm thick), an ITO source electrode 6 (300 nm thick) and, an ITO drain electrode 7 (300 nm thick) were defined using a shadow mask. The resulting structure defines a channel layer/gate insulator layer interface 8. A 300° C. rapid thermal anneal (RTA) in Ar immediately prior to both the ZnO and ITO depositions served to remove adsorbed contaminants from the exposed surface, yielding a noticeable improvement in film quality (particularly for ITO films). After deposition of the ZnO layer, a RTA (typically in $O_2$ or Ar, at 600 to 800° C.) was employed to increase the ZnO channel resistivity and to improve the electrical quality of the channel layer/gate insulating layer interface 8. Following deposition of the ITO source/drain electrodes, a 300° C. RTA in $O_2$ was used to improve the transparency of the ITO layer. In the transistor structure 1 the source/drain electrodes 6 and 7 are disposed on the top surface of the channel layer 5 (from a vertical perspective) and the gate electrode 3 and channel layer 5 are disposed, respectively, on opposing surfaces of the gate insulator layer 4. Consequently, structure 1 allows for high temperature processing of the ZnO channel layer 5 prior to deposition and processing of the ITO source/drain electrodes 6 and 7. Certain electrical and physical characteristics of the TFT structure 1 were evaluated as described below and illustrated in FIGS. 4-7.

Figure 4:
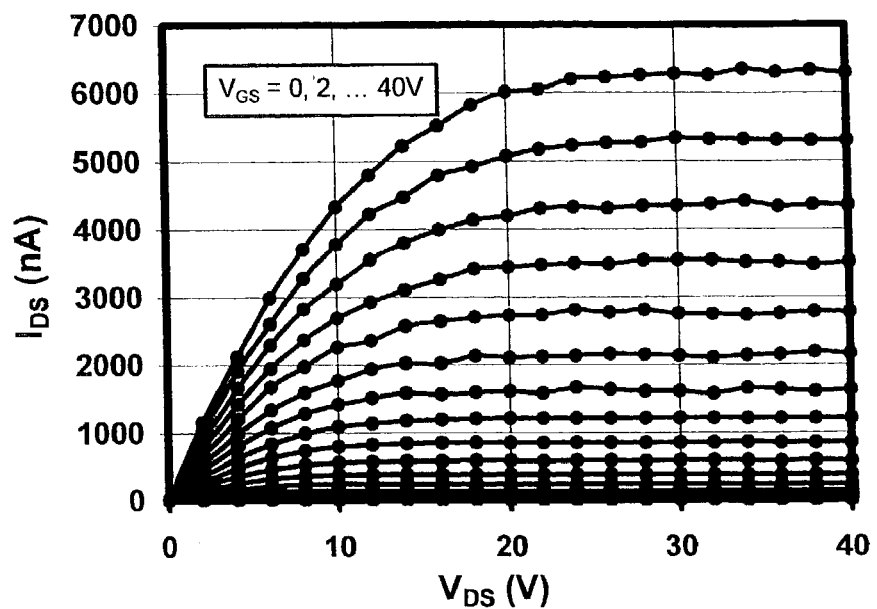
FIG. 4 is a graph showing drain-source current ($I_{DS}$) versus drain-source voltage ($V_{DS}$), as a function of gate-source voltage ($V_{GS}$), for the transistor structure depicted in FIG. 1 (the gate-source voltage varies from +40V (top curve) to +2 V in 2 V steps)

With reference to FIG. 4, n-channel, enhancement-mode behavior is obtained as demonstrated by the fact that a positive gate voltage in excess of ~15 V (the threshold) is required to obtain appreciable drain-source current. These $I_{DS}$-$V_{DS}$ curves exhibit prototypical FET characteristics; of particular significance is the flatness of these curves at large drain voltages (i.e. they exhibit 'hard' saturation). The drain and gate voltages employed are rather large compared to conventional FETs; gate and drain voltages can be reduced to the range expected for typical FET operation (i.e. ~5-10 V), by simply reducing the gate insulator thickness. In the TFT structure 1 the insulator thickness is ~200 nm, as optimized for electroluminescent display applications; if an otherwise identical insulator is resealed to a thickness of 20 nm, the gate and drain voltages will be reduced by a factor of approximately 10.

The $I_{DS}$ of structure 1 is currently rather small (i.e., $I_{DS}$ (max) is about 6 µA in FIG. 4). A larger $I_{DS}$ may be desirable for most applications. The magnitude of $I_{DS}$ is determined by two factors. One is the effective mobility of the channel electrons, $\mu_{eff}$ (about 0.05-0.2 cm$^2$V$^{-1}$s$^{-1}$ for the TFT structure 1). Process/device optimization should result in an improvement in $\mu_{eff}$ by a factor of about 2 to 100 which will lead to a corresponding increase in $I_{DS}$. The second factor is the aspect ratio. The aspect ratio of the TFT structure 1 (the physical width of the gate, Z, divided by the length of the gate, L) is about 2 (with Z=2L=6000 µm). A larger aspect ratio will lead to a larger $I_{DS}$.

Figure 5:
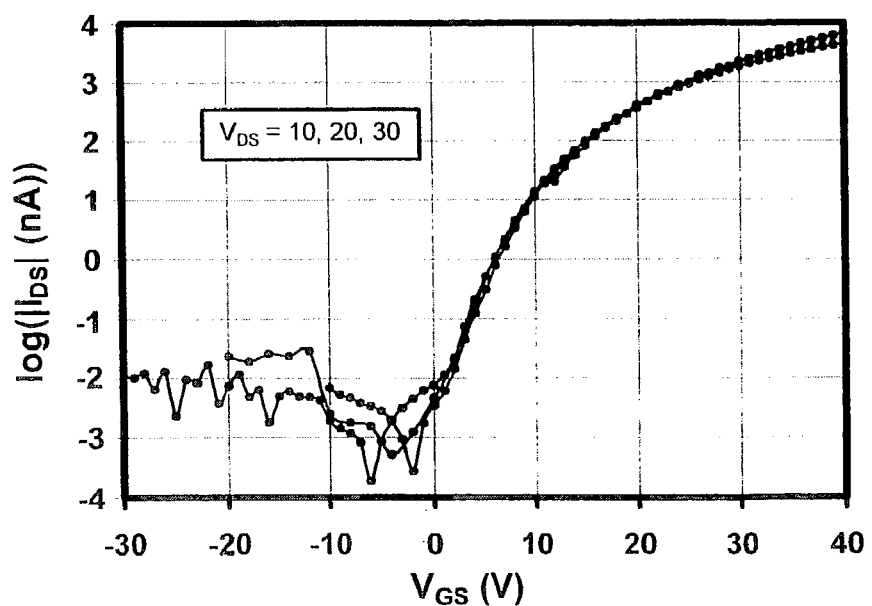
FIG. 5 is a graph showing the $I_{DS}$ VS. $V_{GS}$ characteristics for the transistor structure depicted in FIG. 1 at three different drain-source voltages.

FIG. 5 illustrates the $I_{DS}$-$V_{GS}$ characteristics of the TFT structure 1 at three different drain voltages. This figure shows that there is a factor of 10$^5$-10$^6$ difference between the 'on' and 'off' currents when the transistor is used as a switch.

Figure 6:
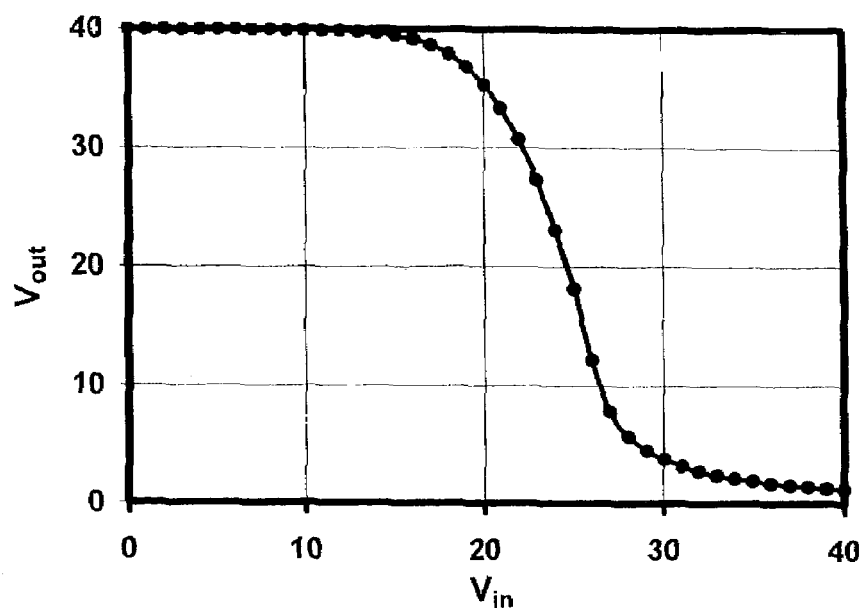
FIG. 6 is a graph showing inverter transfer characteristics for the transistor structure depicted in FIG. 1 using a transparent thin-film resistor load (R=70 MΩ) and a power supply voltage, $V_{DD}$=40 V.

FIG. 6 shows the transfer characteristics of the TFT structure 1 when it is employed as an inverter. A ZnO transparent thin-film resistor (R=70 MΩ) is used as the inverter passive load with a power supply voltage $V_{DD}$=40 V. A logic swing of about 15 V between 15 and 30 V is clearly evident from this curve. This constitutes a demonstration of the use of the presently described transparent TFT as a transparent inverter. In its simplest implementation, a logic inverter is comprised of two constituents: a transistor coupled to a load device. The load device may be a resistor, as employed in this example. Alternatively, a depletion- or enhancement-mode transistor may also be used as load devices, typically offering superior performance. The fundamental property of a logic inverter is that it performs a logical not operation, in which a logic 0 (1) input produces a logic 1(0) output. Successful achievement of a transparent logic inverter, as described herein, is significant since the inverter is the most basic building block for achieving transparent digital electronics. Optimization of the transparent thin film transistor via reducing the insulator thickness, reducing physical dimensions, and increasing the current drive capability (increased aspect ratio and effective mobility) will lead to a significant reduction in the required power supply voltage for inverter operation.

Figure 13:
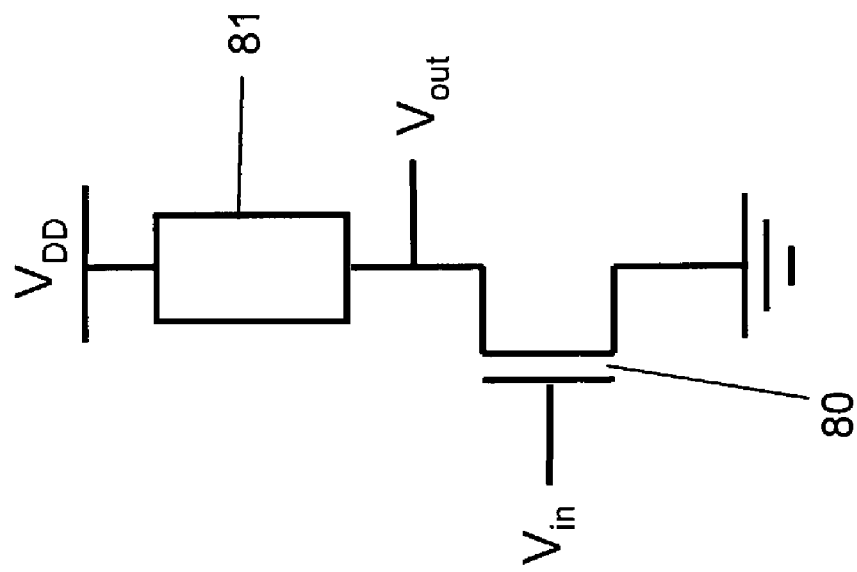
FIG. 13 is a schematic representation of an example of a logic inverter that includes the presently disclosed transistor structure.

One specific example of a logic inverter circuit is depicted in FIG. 13. The logic inverter circuit includes a transistor 80 as presently described. The gate electrode of the transistor 80 is electrically coupled to a voltage input ($V_{in}$), the source electrode of the transistor 80 is electrically coupled to ground, and the drain electrode of the transistor 80 is electrically coupled to a load 81 and a power source ($V_{DD}$). The load 81 may be a transparent thin-film resistor or a transparent thin-film transistor. The voltage ($V_{out}$) out of the circuit is controlled by whether $V_{in}$ turns the transistor 80 on or off.

Transparent transistors may also be employed in amplifier applications. For example, the inverter structures described above can also function as simple analog inverting amplifiers. With the appropriate DC bias at the input, a small input signal (superimposed upon the DC bias) is amplified by the inverter transfer characteristic. In addition to such simple amplifier configurations, these transistors could be directly applied in arbitrary amplifier configurations, with the limitation that the maximum operating frequency will be relatively low due to the low mobility of these devices.

Figure 14:
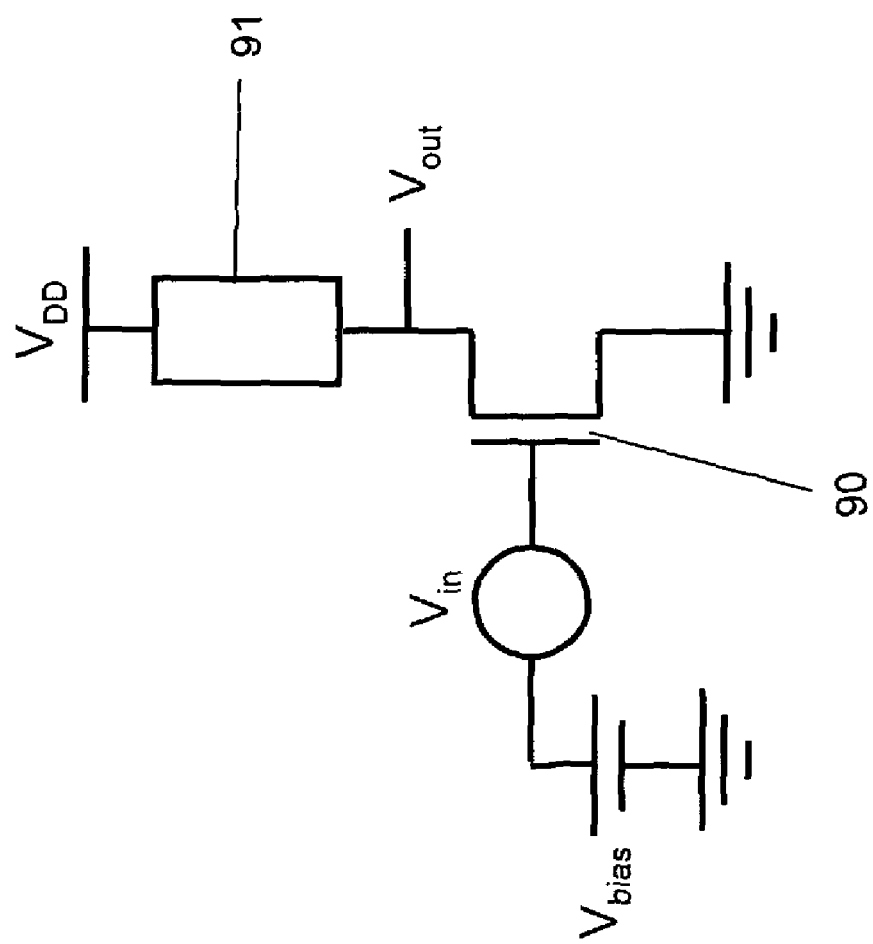
FIG. 14 is a schematic representation of an example of an inverting amplifier circuit that includes the presently disclosed transistor structure.

One specific example of an inverting amplifier circuit is depicted in FIG. 14. The inverting amplifier circuit includes a transistor 90 as presently described. The gate electrode of the transistor 90 is electrically coupled to a voltage input signal ($V_{in}$) and a DC bias ($V_{bias}$). The source electrode of the transistor 90 is electrically coupled to ground, and the drain electrode of the transistor 90 is electrically coupled to a load 91 and a power source ($V_{DD}$). The load 91 may be a transparent thin-film resistor or a transparent thin-film transistor.

Figure 7:
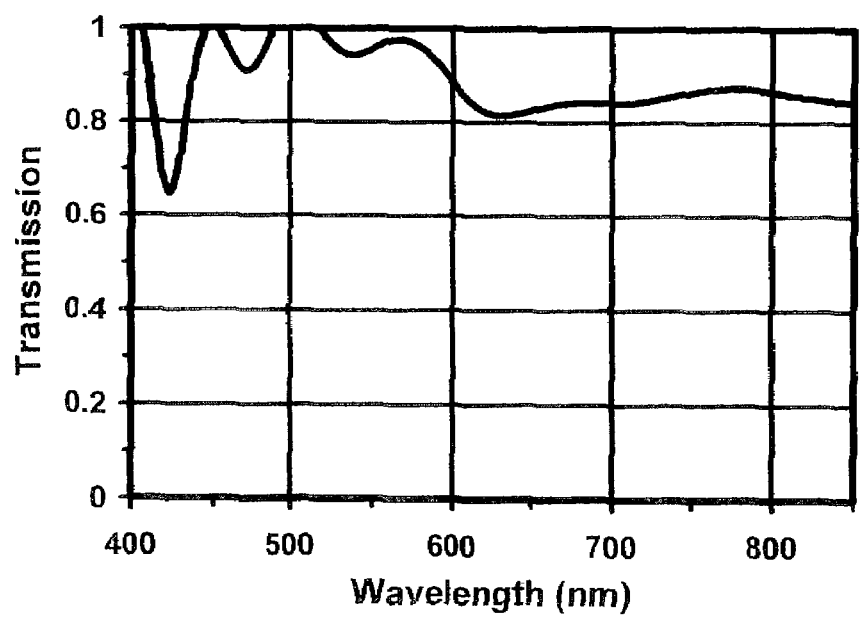
FIG. 7 is a graph showing the optical transmission characteristics through the source or drain portion of the transistor structure depicted in FIG. 1.

FIG. 7 shows the optical transmission of the TFT structure 1 through the source 6 or drain 7 (optical transmission through the channel, not shown here, is higher than through the source or drain). The average transmission in the visible portion of the electromagnetic spectrum (450-700 nm) is about 90% (about 95% through the channel). Visually, the transparent TFT structure is essentially invisible; a slight tinting of the glass substrate is apparent upon close inspection.

FIG. 2

Figure 2:
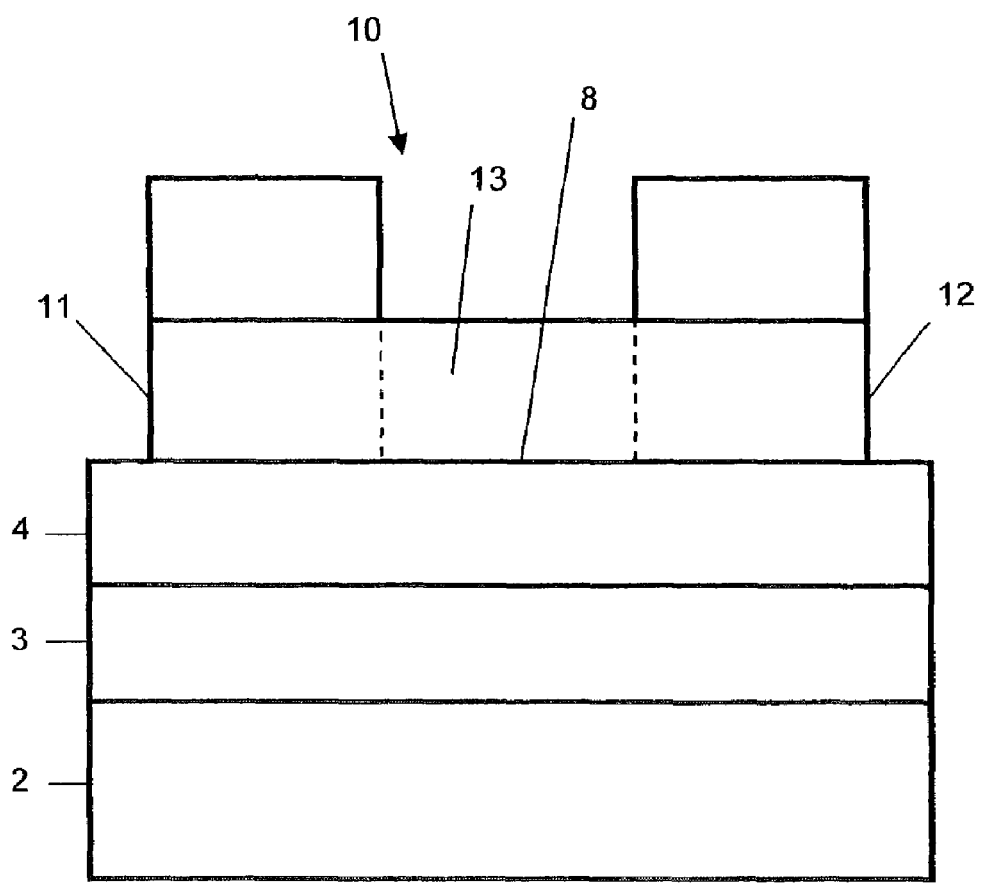
FIG. 2 is a sectional view of a second embodiment of a presently disclosed transistor structure.
Figure 3:
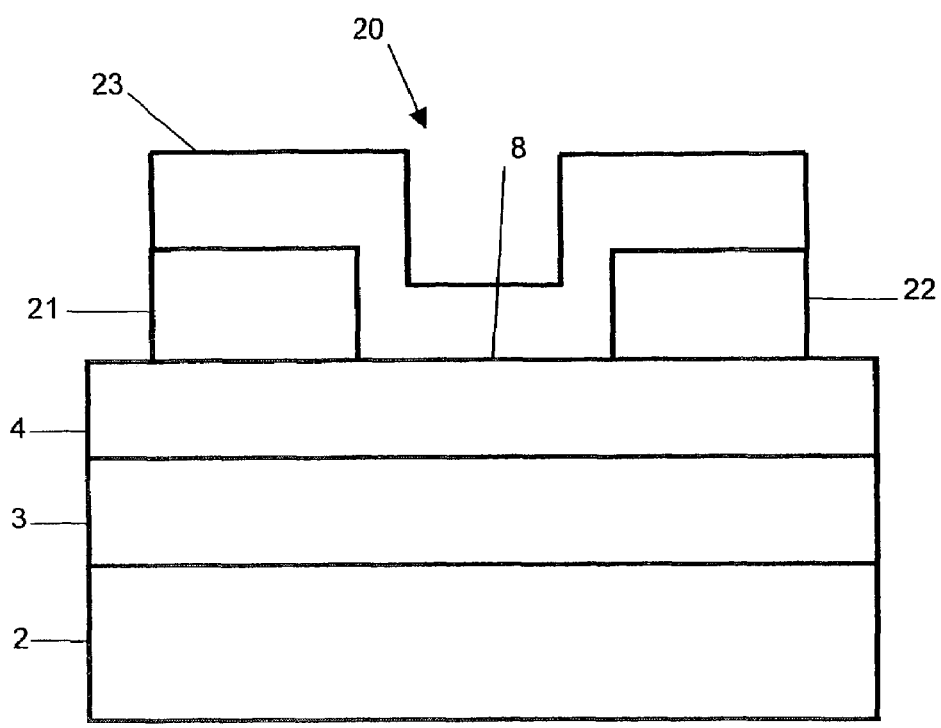
FIG. 3 is a sectional view of a third embodiment of a presently disclosed transistor structure.

In another transparent TFT structure 10 version shown in FIG. 2, a source electrode 11 (100 nm thick) and a drain electrode 12 (100 nm thick) were made by selectively doping the ends of a ZnO channel layer 13 (100 nm thick) with In (or any other suitable n-type dopant). This was accomplished by ion beam sputter depositing a thin (about 5 nm) ITO layer using the source/drain shadow mask before depositing the ZnO channel film. A subsequent high-temperature (~600-800° C.) annealing step was performed to diffusion-dope the ZnO, thus forming n-type doped source/drain regions 11 and 12. The diffusion-doping RTA may also function as the oxidizing RTA for the ZnO. ITO contacts may be placed over the source and drain regions to provide better electrical contact. The substrate 2, gate electrode 3, gate insulator layer 4, and channel layer/gate insulator layer interface 8 are the same as in FIG. 1.

FIG. 3

In a third variation of a TFT structure 20, an ITO source electrode 21 (300 nm thick) and ITO drain electrode 22 (300 nm thick) are deposited prior to formation of a ZnO channel layer 23 (100 nm thick). The ZnO channel layer 23 is subsequently deposited conformally over the ITO source/drain electrodes 21 and 22. After deposition of the ZnO, a 700° C. Ar anneal was performed, followed by a 300° C. oxygen anneal. The substrate 2, gate electrode 3, gate insulator layer 4, and channel layer/gate insulator layer interface 8 are the same as in FIG. 1.

FIG. 8

Figure 8:
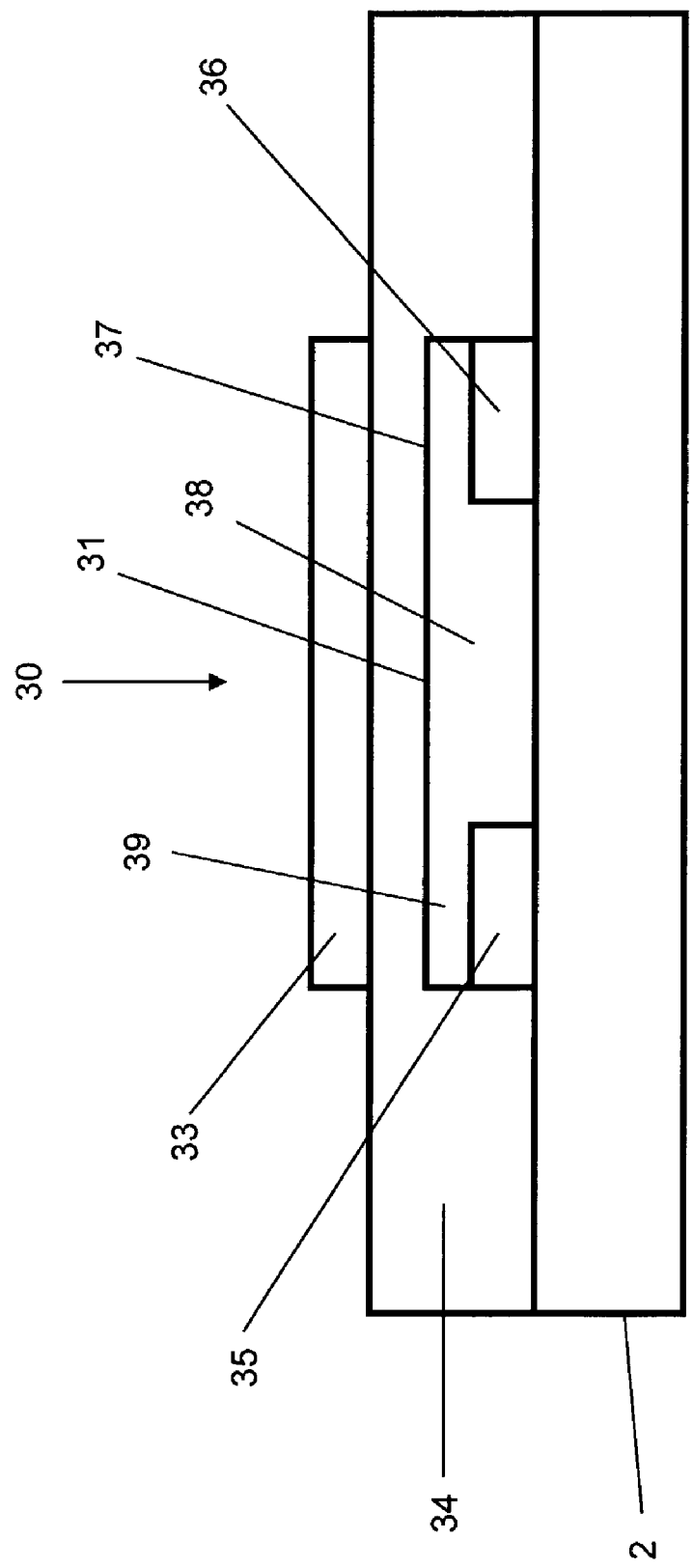
FIG. 8 is a sectional view of a fourth embodiment of a presently disclosed transistor structure.

A fourth variation of a TFT structure 30 is shown in FIG. 8. The TFT structure 30 includes a glass substrate 2 upon which is disposed a source electrode 35 and a drain electrode 36. A channel structure 37 is provided that includes a bulk section 38 positioned between the source electrode 35 and the drain electrode 36 and adjacent to the glass substrate 2. The channel structure 37 also includes an interface section 39 that is integral with the bulk section 38, and interposed between a gate insulator layer 34 and the source electrode 35 and the drain electrode 36, respectively. The interface section 39 may overlap all or only a portion of each of the source electrode 35 and the drain electrode 36. The interface section 39 and the gate insulator layer 34 form a channel layer/gate interface layer 31 that defines a conducting channel for the flow of electrons from the source to the drain. A gate electrode 33 is disposed on the top surface (from a vertical perspective) of the gate insulator layer 34. In other words, the gate electrode 33 and the channel structure 37 are provided on opposing surfaces of the gate insulator layer 34.

The TFT structure 30 may be fabricated, for example, by depositing and patterning a film that defines the source electrode 35 and the drain electrode 36. For instance, a 500 Å ITO source/drain electrode film may be sputtered onto the glass substrate 2. The source and drain patterning may be accomplished via shadow masking or photolithography. The source/drain electrode film could optionally be annealed. The channel structure 37 may then be deposited and patterned over the source electrode 35, the drain electrode 36, and the substrate 2. For example, a 500 Å ZnO film may be sputter deposited, and then patterned via shadow masking or photolithography. The ZnO film could optionally be annealed. Subsequently, the gate insulator layer 34 may then be deposited and patterned over the channel structure 37. For example, a 2000 Å $Al_2O_3$ film may be sputter deposited, and then patterned via shadow masking or photolithography. Vias may be formed through the gate insulator layer 34 to electrically connect to the source electrode 35 and the drain electrode 36. The $Al_2O_3$ film could optionally be annealed. The gate electrode 33 may then be deposited and patterned over the gate insulator layer 34. For example, a 2000 Å ITO film may be sputter deposited, and then patterned via shadow masking or photolithography. The ITO film could optionally be annealed.

FIG. 9

Figure 9:
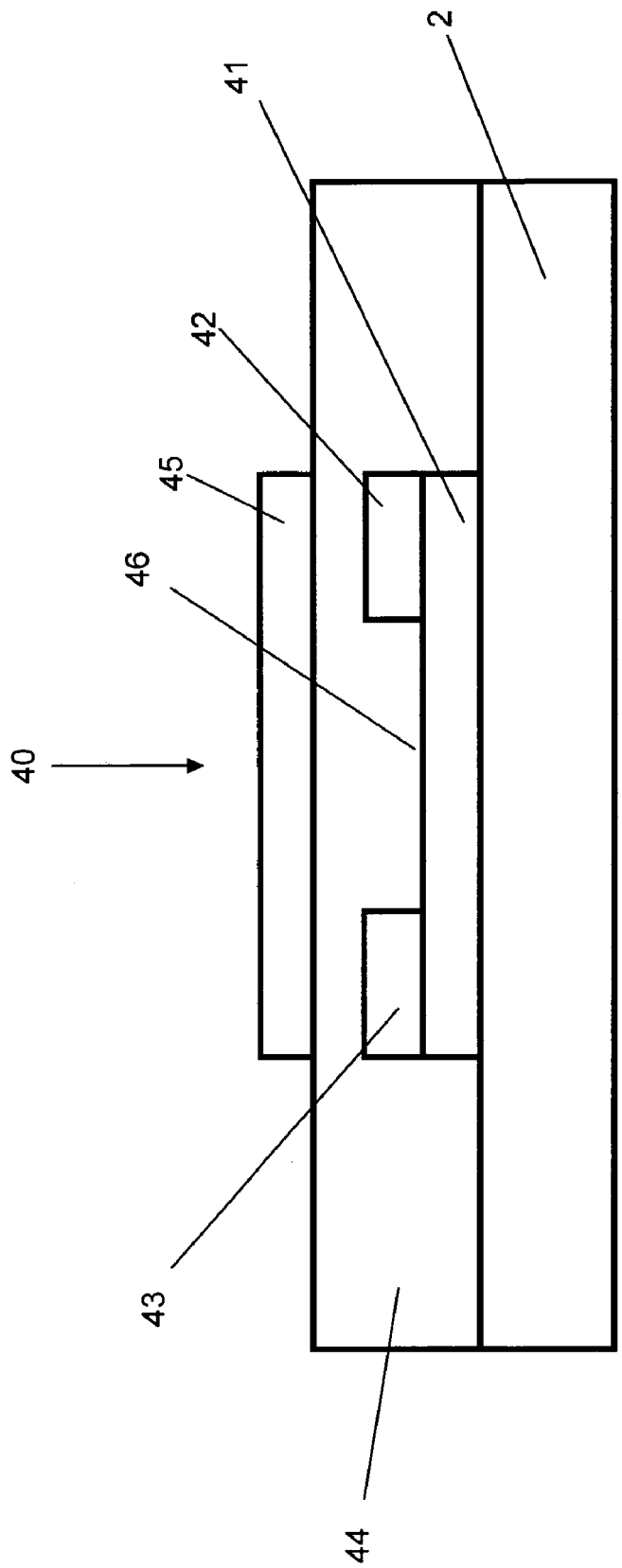
FIG. 9 is a sectional view of a fifth embodiment of a presently disclosed transistor structure.

A fifth variation of a TFT structure 40 is shown in FIG. 9. The TFT structure 40 includes a glass substrate 2 upon which is disposed a channel layer 41. A source electrode 43 and a drain electrode 42 are provided on a surface of the channel layer 41 opposing the surface that is adjacent to the glass substrate 2. A gate insulator layer 44 is disposed over the channel layer 41, the source electrode 43, and the drain electrode 42. A gate electrode 45 is disposed on the top surface (from a vertical perspective) of the gate insulator layer 44. In other words, the gate electrode 45 and the channel layer 41 are provided on opposing surfaces of the gate insulator layer 44. The resulting structure defines a channel layer/gate insulator layer interface 46.

The TFT structure 40 may be fabricated, for example, by depositing and patterning a film that defines the channel layer 41. For instance, a 500 Å ZnO film may be sputter deposited, and then patterned via shadow masking or photolithography. The ZnO film could optionally be annealed. The source electrode 43 and the drain electrode 42 may then be deposited and patterned. For example, a 500 Å ITO source/drain electrode film may be sputtered deposited, and then patterned via shadow masking or photolithography. The source/drain electrode film could optionally be annealed. Subsequently, the gate insulator layer 44 may then be deposited and patterned over the channel layer 41, the source electrode 43, and the drain electrode 42. For example, a 2000 Å $Al_2O_3$ film may be sputter deposited, and then patterned via shadow masking or photolithography. Vias may be formed through the gate insulator layer 44 to electrically connect to the source electrode 43 and the drain electrode 42. The $Al_2O_3$ film could optionally be annealed. The gate electrode 45 may then be deposited and patterned over the gate insulator layer 44. For example, a 2000 Å ITO film may be sputter deposited, and then patterned via shadow masking or photolithography. The ITO film could optionally be annealed.

FIG. 10

Figure 10:
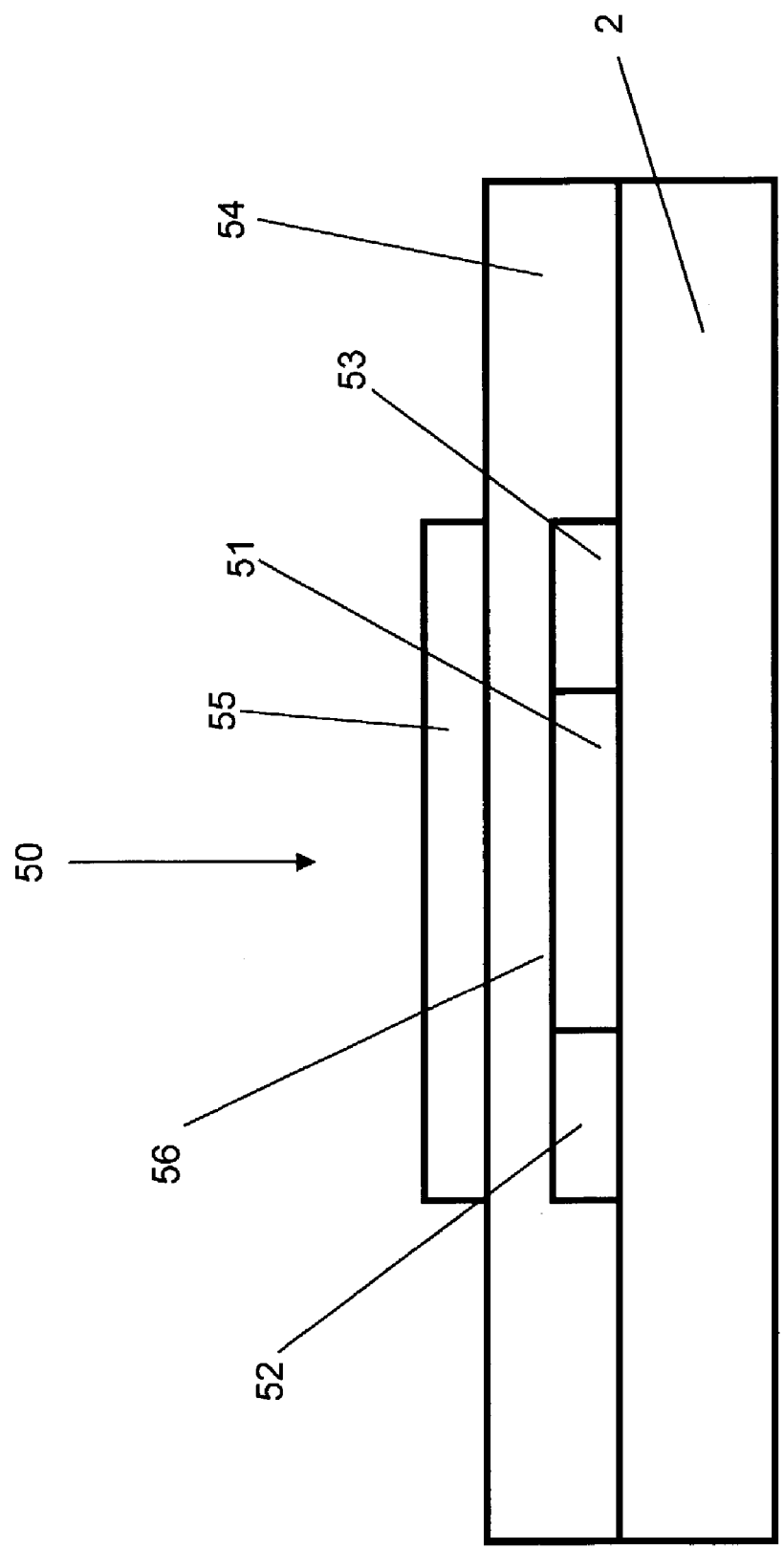
FIG. 10 is a sectional view of a sixth embodiment of a presently disclosed transistor structure.

A sixth variation of a TFT structure 50 is shown in FIG. 10. The TFT structure 50 includes a glass substrate 2 upon which is disposed a channel layer 51, a source electrode 52, and a drain electrode 53. A gate insulator layer 54 is disposed over the channel layer 51, the source electrode 52, and the drain electrode 53. A gate electrode 55 is disposed on the top surface (from a vertical perspective) of the gate insulator layer 54. In other words, the gate electrode 55 and the channel layer 51 are provided on opposing surfaces of the gate insulator layer 54. The resulting structure defines a channel layer/gate insulator layer interface 56.

The TFT structure 50 may be fabricated, for example, by depositing and patterning a film that defines the channel layer 51. For instance, a 500 Å ZnO film may be sputter deposited, and then patterned via shadow masking or photolithography. The ZnO film could optionally be annealed. The source electrode 52 and the drain electrode 53 may be made by selectively doping the ends of the channel layer 51 with In, Al, Ga, or any other suitable n-type dopant. Subsequently, the gate insulator layer 54 may then be deposited and patterned over the channel layer 51, the source electrode 52, and the drain electrode 53. For example, a 2000 Å $Al_2O_3$ film may be sputter deposited, and then patterned via shadow masking or photolithography. Vias may be formed through the gate insulator layer 54 to electrically connect to the source electrode 52 and the drain electrode 53. The $Al_2O_3$ film could optionally be annealed. The gate electrode 55 may then be deposited and patterned over the gate insulator layer 54. For example, a 2000 Å ITO film may be sputter deposited, and then patterned via shadow masking or photolithography. The ITO film could optionally be annealed.

Having illustrated and described the principles of the disclosed devices and methods with reference to several embodiments, it should be apparent that these devices and methods may be modified in arrangement and detail without departing from such principles.

What is claimed is:

1. A field effect transistor, comprising:
   a channel layer comprising a substantially insulating, substantially transparent, material selected from ZnO, $SnO_2$, or $In_2O_3$, wherein the channel layer comprising ZnO is vapor deposited;

a gate insulator layer comprising a substantially transparent material and being located adjacent to the channel layer so as to define a channel layer/gate insulator layer interface;

a source that can inject electrons into the channel layer for accumulation at the channel layer/gate insulator layer interface; and a drain that can extract electrons from the channel layer;

wherein the field effect transistor is configured for enhancement-mode operation, and exhibits an optical transmission through the field effect transistor of at least about 70% in the visible portion of the electromagnetic spectrum.

2. The transistor according to claim 1, wherein the channel layer/gate insulator layer interface defines an electron conducting channel between the source and the drain.

3. The transistor according to claim 1, wherein the field effect transistor comprises a thin film transistor.

4. The transistor according to claim 1, wherein the channel layer material is a different material from the gate insulator layer material.

5. The transistor according to claim 1, further comprising a gate electrode and a substrate, and wherein the source, drain, gate electrode, and substrate are each made from a substantially transparent material.

6. The transistor according to claim 1, further comprising a gate electrode and a substrate, and wherein at least one of the source, drain, gate electrode, or substrate is made from an opaque material.

7. The transistor according to claim 1, wherein the gate insulator layer comprises $Al_2O_3/TiO_2$.

8. The transistor according to claim 5, wherein the gate insulator layer comprises $Al_2O_3/TiO_2$ or $Al_2O_3$; the source, drain, and gate electrode each comprise indium-tin oxide; and the substrate comprises glass.

9. The transistor according to claim 1, wherein the channel layer/gate insulator layer interface defines a discrete material boundary.

10. The transistor according to claim 1, wherein the optical transmission is at least about 90% in the visible portion of the electromagnetic spectrum.

11. The transistor according to claim 1, wherein the channel layer is not ion implanted.

12. The transistor according to claim 1, wherein the channel layer material exhibits a bandgap of less than about 5 eV.

13. An optoelectronic display device comprising at least one display element coupled to a switch comprising an enhancement-mode, field effect transistor according to claim 1.

14. The optoelectronic display device of claim 13, wherein the device comprises an active-matrix liquid-crystal display.

15. A substantially transparent, dynamic random-access memory cell, comprising a substantially transparent capacitor coupled to an enhancement-mode, field effect transistor according to claim 1.

16. A substantially transparent logic inverter, comprising a load device coupled to an enhancement-mode, field effect transistor according to claim 1.

17. An amplifier comprising an enhancement-mode, field effect transistor according to claim 1.

18. The transistor according to claim 1, wherein the channel layer comprises $In_2O_3$.

19. The transistor according to claim 1, wherein the substantially insulating $In_2O_3$ or $SnO_2$ comprises a chemical vapor deposited channel layer, a sputtered channel layer, a spin-coated channel layer, a physical vapor deposited channel layer, a vapor phase epitaxy channel layer or a molecular beam epitaxy layer.

20. The transistor according to claim 1, wherein the substantially insulating ZnO, $In_2O_3$ or $SnO_2$ is sputter deposited in an atmosphere that includes at least one sputter gas and at least one film-modifying gas.

21. A field effect transistor, comprising:

a channel layer comprising a substantially transparent material selected from substantially insulating ZnO, substantially insulating $SnO_2$, or substantially insulating $In_2O_3$, the substantially insulating $SnO_2$ or substantially insulating $In_2O_3$ being produced by annealing and the substantially insulating ZnO being vapor deposited and the resulting ZnO layer undergoes annealing;

a gate insulator layer located adjacent to the channel layer;

a source;

a drain; and a gate electrode;

wherein the field effect transistor is configured for enhancement-mode operation, and exhibits an optical transmission through the field effect transistor of at least about 70% in the visible portion of the electromagnetic spectrum.

22. The transistor according to claim 21, wherein the gate insulator layer comprises a substantially transparent material.

23. The transistor according to claim 22, wherein the gate insulator layer comprises $Al_2O_3/TiO_2$.

24. The transistor according to claim 21, further comprising a substrate, wherein the source, drain, gate electrode, and substrate are each made from a substantially transparent material.

25. The transistor according to claim 21, further comprising a substrate, and wherein at least one of the source, drain, gate electrode, or substrate is made from an opaque material.

26. The transistor according to claim 21, wherein the channel layer comprises insulating ZnO fabricated by annealing a ZnO film for about 1 minute to about 2 hours at a temperature of about 300 to about 1000° C. in a substantially oxidative or inert atmosphere.

27. The transistor according to claim 26, wherein the gate insulator layer comprises $Al_2O_3/TiO_2$ or $Al_2O_3$; the source, drain, and gate electrode each comprise indium-tin oxide; and the substrate comprises glass.

28. The transistor according to claim 21, wherein the channel layer is interposed between the gate insulator layer and the source and drain.

29. The transistor according to claim 21, wherein the channel layer and the gate electrode are disposed, respectively, on opposing surfaces of the gate insulator layer.

30. The transistor according to claim 21, wherein the channel layer comprises undoped ZnO.

31. The transistor according to claim 21, wherein the channel layer material exhibits a bandgap of less than about 5 eV.

32. The transistor according to claim 21, wherein the channel layer is not interposed between the gate insulator layer and the source and drain.

33. The transistor according to claim 21, further comprising a substrate, and wherein the gate electrode is disposed adjacent to the substrate.

34. The transistor according to claim 21, wherein the annealed ZnO, $SnO_2$, or $In_2O_3$ has a lower oxygen vacancy concentration relative to ZnO, $SnO_2$ or $In_2O_3$ that has not been annealed.

35. An optoelectronic display device comprising at least one display element coupled to a switch comprising an enhancement-mode, field effect transistor according to claim 21.

36. The optoelectronic display device of claim 35, wherein the device comprises an active-matrix liquid-crystal display.

37. A substantially transparent, dynamic random-access memory cell, comprising a substantially transparent capacitor coupled to an enhancement-mode, field effect transistor according to claim 21.

38. A substantially transparent logic inverter, comprising a load device coupled to an enhancement-mode, field effect transistor according to claim 21.

39. An amplifier comprising an enhancement-mode, field effect transistor according to claim 15.

40. The transistor according to claim 21, wherein the annealed ZnO, $SnO_2$, or $In_2O_3$ has a lower degree of oxygen deficiency relative to ZnO, $SnO_2$, or $In_2O_3$ that has not been annealed.

41. The transistor according to claim 21, wherein the channel layer comprises $In_2O_3$.

42. The transistor according to claim 21, wherein the substantially insulating $In_2O_3$ or $SnO_2$ is chemical vapor deposited, sputtered, spin-coated, physical vapor deposited, vapor phase epitaxy, or a molecular beam epitaxy.

43. The transistor according to claim 21, wherein the substantially insulating ZnO, $In_2O_3$ or $SnO_2$ is sputter deposited in an atmosphere that includes at least one sputter gas and at least one film-modifying gas.

44. A thin film transistor comprising:
a discrete channel layer comprising an inorganic, substantially insulating material selected from ZnO, $SnO_2$ or $In_2O_3$, wherein the channel layer comprising ZnO is produced by vapor deposition; and
a gate insulator layer located adjacent to the channel layer, wherein the combined channel layer and gate insulator layer construct exhibits an optical transmission through the construct of at least about 90% in the visible portion of the electromagnetic spectrum, and is configured for enhancement-mode operation.

45. The transistor according to claim 44, wherein the combined channel layer and gate insulator layer construct exhibits an optical transmission through the construct of at least about 95% in the visible portion of the electromagnetic spectrum.

46. The transistor according to claim 45, wherein the channel layer comprises insulating ZnO.

47. The transistor according to claim 44, wherein the channel layer comprises $In_2O_3$.

48. The transistor according to claim 44, wherein the substantially insulating $In_2O_3$ or $SnO_2$ is produced by chemical vapor deposition, sputtering, spin coating, physical vapor deposition, vapor phase epitaxy, or molecular beam epitaxy.

49. The transistor according to claim 44, wherein the substantially insulating ZnO, $In_2O_3$ or $SnO_2$ is sputter deposited in an atmosphere that includes at least one sputter gas and at least one film-modifying gas.

50. A method for operating a field effect transistor, comprising:
providing a field effect transistor that includes (i) a channel layer comprising a substantially insulating, substantially transparent material selected from ZnO, $SnO_2$, or $In_2O_3$, wherein the ZnO is produced by vapor deposition; (ii) a gate insulator layer located adjacent to the channel layer so as to define a channel layer/gate insulator layer interface (iii) a source; (iv) a drain; and (v) a gate electrode, wherein the field effect transistor exhibits an optical transmission through the field effect transistor of at least about 70% in the visible portion of the electromagnetic spectrum; and
applying a positive voltage to the gate electrode to effect a flow of electrons at the channel layer/gate insulator layer interface, wherein in the absence of an applied positive voltage there is negligible electron flow relative to the electron flow when the positive voltage is applied to the gate electrode.

51. The method according to claim 50, wherein the gate insulating layer comprises a substantially transparent material.

52. The method according to claim 50, wherein the electrons flowing at the channel layer/gate insulator layer interface have an effective mobility of about 0.05 $cm^2V^{-1}s^{-1}$ to about 20 $cm^2V^{-1}s^{-1}$.

53. The method according to claim 50, wherein a voltage of about 5 to about 40 V is applied to the gate electrode and the drain.

54. A microelectronic construct, comprising:
a continuous channel layer film comprising a substantially insulating material selected from ZnO, $SnO_2$, or $In_2O_3$, wherein the channel layer comprising ZnO is produced by vapor deposition and the channel layer comprising $SnO_2$ exhibits an optical transmission of at least about 70% in the visible portion of the electromagnetic spectrum; and
a plurality of patterned gate insulator layers, sources, and drains arranged so that each gate insulator layer, source and drain forms, along with the continuous channel layer film, a discrete electrical device, wherein the gate insulator layer is located adjacent to the continuous channel layer film so as to define a channel layer/gate insulator layer interface.

55. The microelectronic construct according to claim 54, wherein the continuous channel layer film is not patterned.

56. A field effect transistor, comprising:
a channel layer comprising a substantially insulating, substantially transparent $In_2O_3$ material;
a gate insulator layer comprising a substantially transparent material and being located adjacent to the channel layer so as to define a channel layer/gate insulator layer interface;
a source that can inject electrons into the channel layer for accumulation at the channel layer/gate insulator layer interface; and
a drain that can extract electrons from the channel layer;
wherein the field effect transistor is configured for enhancement-mode operation.

57. A field effect transistor, comprising:
a channel layer comprising a substantially insulating, substantially transparent $In_2O_3$ material, the substantially insulating $In_2O_3$ being produced by annealing;
a gate insulator layer located adjacent to the channel layer;
a source;
a drain; and
a gate electrode;
wherein the field effect transistor is configured for enhancement-mode operation.

* * * * *